(12) United States Patent  
Wu et al.

(10) Patent No.: US 8,205,997 B2  
(45) Date of Patent: Jun. 26, 2012

(54) TOUCH CONTROL BUTTON APPARATUS AND ELECTRONIC APPARATUS UTILIZING THE TOUCH CONTROL BUTTON APPARATUS

(75) Inventors: Chao-Ming Wu, Yilan (TW); Chin-Kuan Lin, Taipei County (TW); Yi-Tseng Lin, Taichung (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 301 days.

(21) Appl. No.: 12/612,668

(22) Filed: Nov. 4, 2009

(65) Prior Publication Data

US 2011/0000776 A1   Jan. 6, 2011

(30) Foreign Application Priority Data

Jul. 6, 2009   (CN) .......................... 2009 1 0158327

(51) Int. Cl.  
*G01D 11/28* (2006.01)  
*F21V 33/00* (2006.01)  
*H03K 17/975* (2006.01)  
*H01H 9/00* (2006.01)  
*G06F 3/041* (2006.01)

(52) U.S. Cl. .......... 362/23; 200/600; 200/313; 345/173; 362/95

(58) Field of Classification Search ................ 200/600, 200/313; 345/175; 362/23, 95  
See application file for complete search history.

(56) References Cited

U.S. PATENT DOCUMENTS

| | | | | |
|---|---|---|---|---|
| 6,664,489 B2 * | 12/2003 | Kleinhans et al. | ............ | 200/313 |
| 6,707,027 B2 * | 3/2004 | Liess et al. | ..................... | 250/221 |
| 7,315,005 B2 * | 1/2008 | Cenedese | ..................... | 200/310 |
| 7,705,257 B2 * | 4/2010 | Arione et al. | ................. | 200/314 |
| 2003/0189830 A1 * | 10/2003 | Sugimoto et al. | ............. | 362/294 |
| 2007/0151836 A1 * | 7/2007 | Oh | .................................. | 200/314 |
| 2008/0136792 A1 * | 6/2008 | Peng et al. | ..................... | 345/174 |
| 2009/0065336 A1 * | 3/2009 | Bayley et al. | ................. | 200/313 |

* cited by examiner

*Primary Examiner* — Jong-Suk (James) Lee  
*Assistant Examiner* — David J Makiya  
(74) *Attorney, Agent, or Firm* — Li & Cai Intellectual Property (USA) Office

(57) ABSTRACT

A touch control button apparatus including a touch control light emitting surface, a touch sensing conductor, a touch sensing device and a light emitting device, which is under the touch control light emitting surface and surrounded by the touch sensing conductor. The touch sensing device detects the capacitance value variation of the touch sensing conductor when the touch control light emitting surface is touched by the object, to determine how the light emitting device is lightened.

19 Claims, 7 Drawing Sheets

(a)

(b)

(a)

(b)

TOUCH CONTROL BUTTON APPARATUS AND ELECTRONIC APPARATUS UTILIZING THE TOUCH CONTROL BUTTON APPARATUS

BACKGROUND OF THE INVENTION

1. Field of the Invention

The present invention relates to a touch control button apparatus and an electronic apparatus utilizing the touch control button apparatus, and particularly relates to a touch control button apparatus having light emitting devices and buttons in the same region, and an electronic apparatus utilizing the touch control button apparatus.

2. Description of the Prior Art

FIG. 1 is a schematic diagram illustrating a prior art touch control button 100. As shown in FIG. 1, the touch control button 100 comprises a light emitting device 101, a light guide board 103 and a button region 105. As shown in FIG. 1, when the button region 105 is pressed, the light emitting device 101 emits light, and then the light is guided to the button region 105 via the light guide board 103. However, such structure includes disadvantage that the light emitting device 101 and the button region 105 are independent. Accordingly, the process thereof is more complicated, and the cost of the light guide board 103 can not be avoided. Additionally, the light emitting device 101 and the button region 105 need different power.

SUMMARY OF THE INVENTION

Accordingly, one objective of the present invention is to provide a touch control button apparatus, which has a touch control region and a light emitting device in the same region.

One embodiment of the present invention discloses a touch control button apparatus including a touch control light emitting surface, a touch sensing conductor, a touch sensing device and a light emitting device, which is under the touch control light emitting surface and surrounded by the touch sensing conductor. The touch sensing device detects the capacitance value variation of the touch sensing conductor when the touch control light emitting surface is touched by the object, to determine how the light emitting device is lightened.

Furthermore, an electronic apparatus utilizing above-mentioned touch control button apparatus is also disclosed.

According to above-mentioned embodiment, the touch control button, the light emitting device and the touch sensing conductor can be provided in the same region (i.e. the light emitting device is provided between the touch control button and the touch sensing conductor). By this way, the manufacturing process can be simplified and the convenience for designing a peripheral circuit can be increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
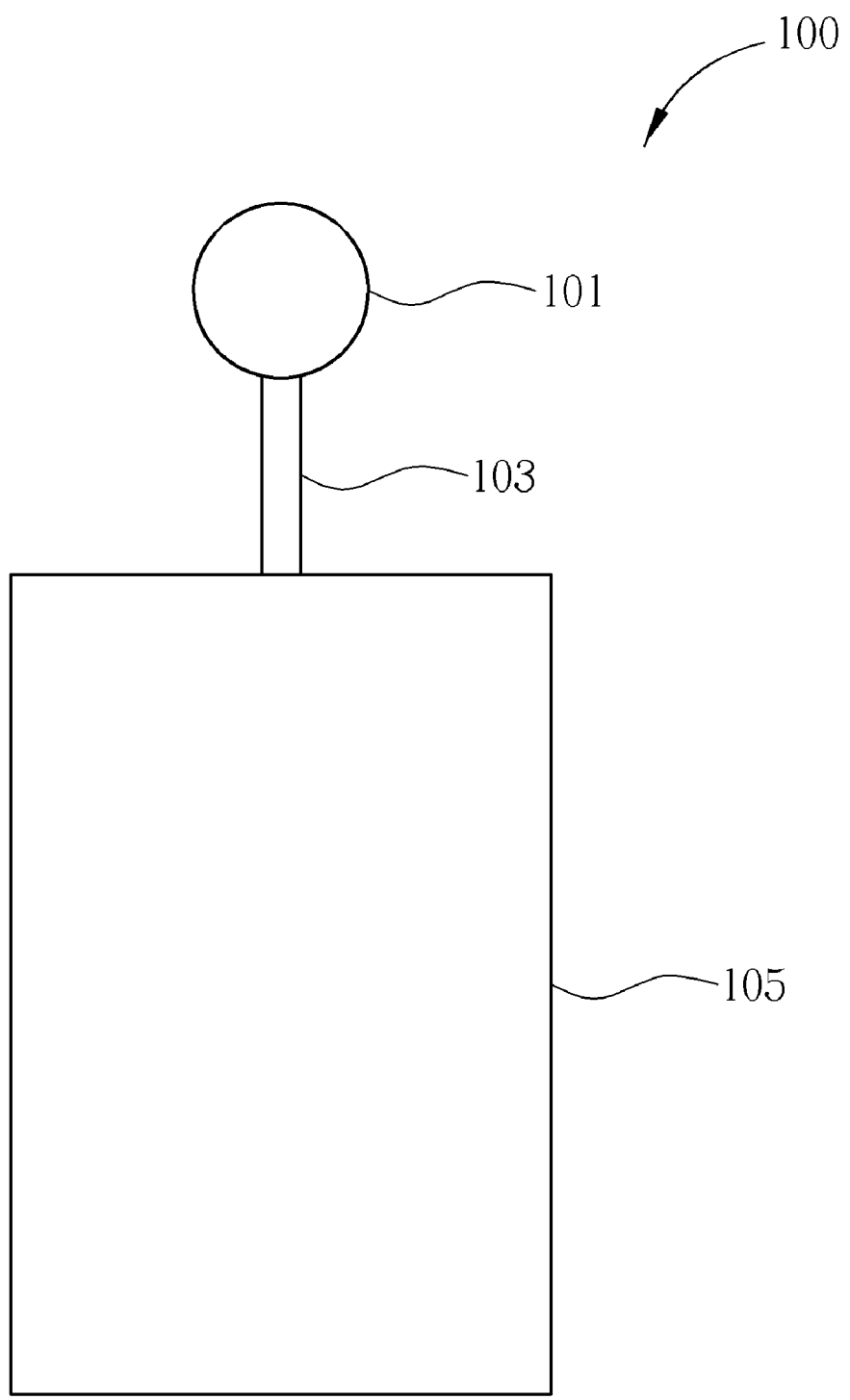
FIG. 1 is a schematic diagram illustrating a prior art touch control button.
Figure 2:
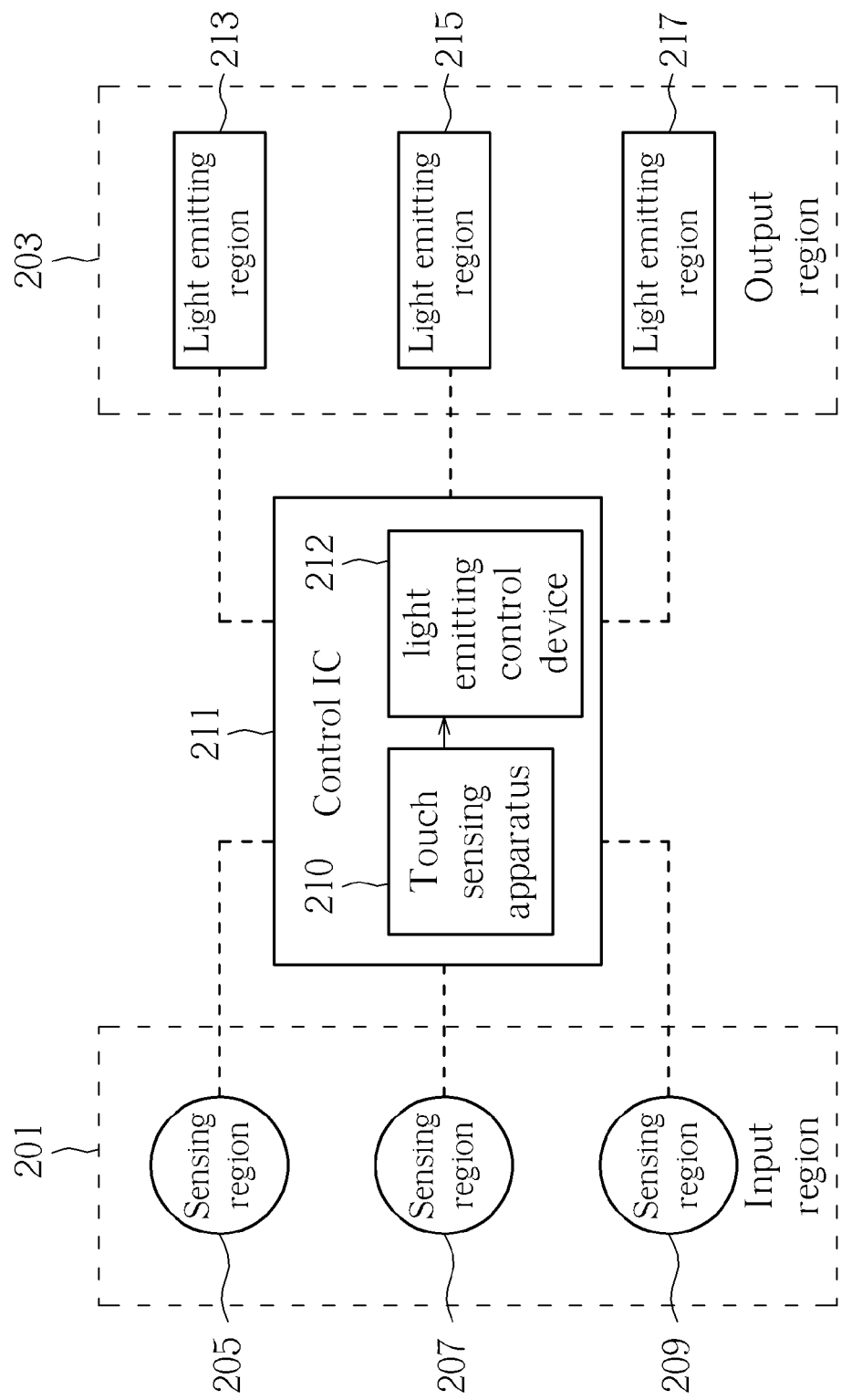
FIG. 2 is a schematic diagram illustrating the operation of the touch control button apparatus according to an embodiment of the present application.

FIG. 2 is a schematic diagram illustrating the operation of the touch control button apparatus according to an embodiment of the present application. The concept of the present application can be clearly understood according to this figure. As shown in FIG. 2, a touch control button according to an embodiment can include an input region 201 and an output region 203. The input region 201 can include a plurality of sensing regions 205, 207 and 209, and the output region 203 includes a plurality of light emitting devices 213, 215 and 217. The touch sensing apparatus 210 will sense the sensing regions 205, 207 and 209 are touched after some object such as a finger of a human touches the sensing regions 205, 207 and 209. In one embodiment, the touch sensing apparatus 210 can comprise a touch sensing conductor and a touch sensing device. The touch sensing conductor is utilized to sense if the touch sensing control button is touched by an object, and the touch sensing device detects capacitance value variation of the touch sensing conductor, to determine if the sensing regions 205, 207 and 209 are touched or not. After that, the light emitting control device 212 receives a signal from the touch sensing device of the touch sensing apparatus 210, to determine if the light emitting devices 213, 215 or 217 emit light or not. In one embodiment, the touch sensing apparatus 210 and the light emitting control device 212 can be integrated to an integration circuit (IC) 211.

Figure 3:
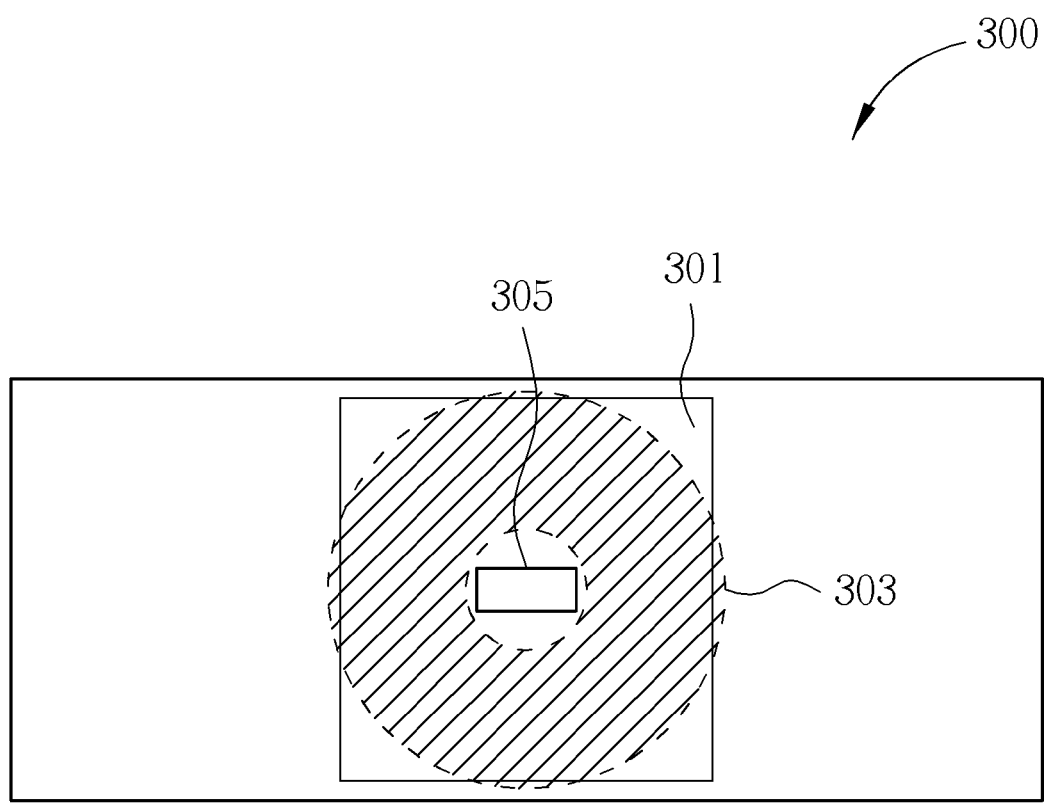
FIG. 3 is a top view of the touch control button according to an embodiment of the present application.

FIG. 3 is a top view of the touch control button 300 according to an embodiment of the present application. As shown in FIG. 3, the touch control button 300 includes a touch control light emitting surface 301, a touch sensing conductor 303 (i.e. the touch sensing conductor in the touch sensing apparatus 210 shown in FIG. 2) and a light emitting device 305. The touch sensing conductor 303 is utilized to sense if the touch control light emitting surface 301 is touched by an objective such as a finger of a user. The light emitting device 305 is under the touch control light emitting surface 301, preferably, under the center. For more detail, the touch control light emitting surface 301 and the touch sensing conductor 303 are not on the same surface, and the light emitting device 305 is surrounding by the touch sensing conductor 303. The touch sensing device (i.e. the touch sensing device in the touch sensing apparatus 210 in FIG. 2) senses the capacitance value variation of the touch sensing conductor 303 when the touch sensing conductor 303 senses the touch control light emitting surface 301 is touched by an objective. By this way, the touch control light emitting surface 301 can be determined that it is touched by an objective, and a signal is provided to a light emitting control device (i.e. the light emitting control device 212) such that the light emitting control device can control the light emitting device 305 to turn on (light) or turn off (dark).

In other words, the light emitting control device controls how the light emitting device is lightened. For example, if the light emitting device 305 does not emit light, the light emitting device 305 turns on and emits light when the touch sensing conductor 303 senses to be touched. Oppositely, while the light emitting device 305 is emitting light, the light emitting device 305 turns off and stops emitting light when the touch sensing conductor 303 senses to be touched. At least part of light from the light emitting device 305 can pass through the touch control light emitting surface 301, such that the touch control light emitting surface 301 can also be regarded as a light emitting region. In one embodiment, the touch sensing conductor 303 is a capacitance sensing detection point, if a finger of a user touches the touch control light emitting surface 301, a sensing charge value will be generated from the touch control light emitting surface to the touch sensing conductor, such that capacitance variation is caused. Also, the touch sensing device can detect the capacitance variation and determine that the touch control light emitting surface 301 is touched. It should be noted that, the object is not limited to a part of a human body, other objects that can make the control sensing conductor sense a charge variation can be utilized to active the touch control light emitting surface.

Figure 4:
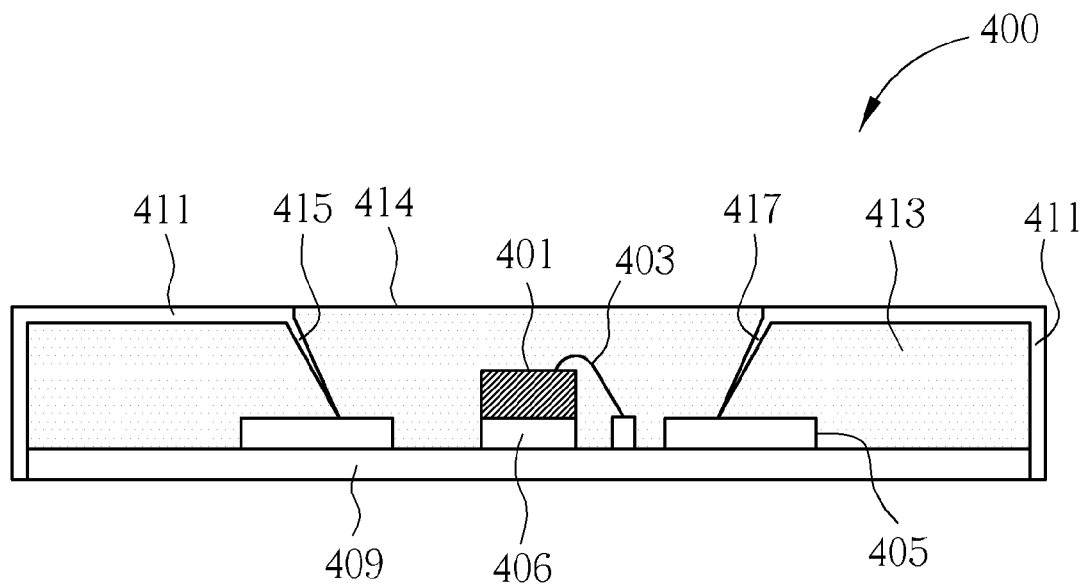
FIG. 4 is a cross section view of the touch control button according to an embodiment of the present application.
Figure 4:
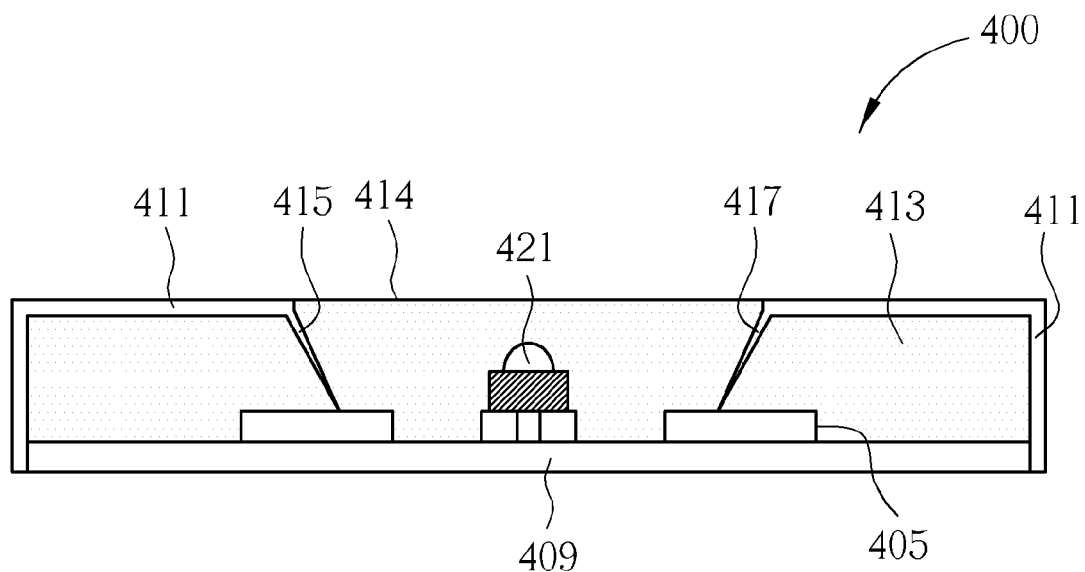

FIG. 4 is a cross section view of the touch control button 400 according to an embodiment of the present application. FIG. 4 (a) utilizes a COB (chip on board) structure. Also, FIG. 4 (b) utilizes a SMD (Surface Mount Device) structure. As shown in FIG. 4 (a), the light emitting device 401 and the touch sensing conductor 405 are both located on the circuit board 409. Also, the light emitting device 401 is electrically connected to the circuit board 409 via a metal line 403. For more detail, a metal pad 406 can be provided under the light emitting device 401 when the touch sensing conductor 405 is produced, to provide heat sinking or another electrical connection path of the light emitting device 401. Accordingly, the metal pad 406 can also be regarded as a heat sinking pad, an electric conduction layer or a heat sinking conductor layer, depending on the function thereof. Additionally, the touch sensing conductor 405 and the metal pad 406 can be a copper foil layer or other electric conduction materials.

According to one embodiment of the present application, a manufacturing process of the touch control button 400 can be regarded as below: providing a reflection cover 411 with a reserved hole 414; utilizing adhesive tape or similar material to seal the hole 414; fill epoxy 413 (i.e. sealing glue material) to a space defined by the reflection cover 411 and the adhesive tape to cover the light emitting device 401 and the touch sensing conductor 405. The epoxy 413 fixes relative locations of the touch control button 400, the light emitting device 401 and the touch sensing conductor 405. By this way, the reflection cover 411 defines the light emitting location of the touch control light emitting surface. For more detail, the inclined planes 415, 417 of the reflection cover 411 defines the hole 414, that also means an opening of the touch control light emitting region is defined.

After the epoxy fills up the space defined by the reflection cover 411, utilize the circuit board 409 to cover it. After the epoxy hardens, a flat touch control light emitting surface is produced, and generation of the touch control button 300 shown in FIG. 3 is accomplished. In this case, the light emitting device 401 and the touch sensing conductor 405 are already provided on the circuit board 409. The structure shown in FIG. 4 (b) is similar with that of FIG. 4 (a), one difference between the structures is that the light emitting device 401 is a light emitting diode (LED) die, but the light emitting device 421 is a surface mount light emitting device (SMD). It should be noted that the light emitting devices 401 and 421 are not limited to LED or SMD, other types of LED or other types of light emitting devices can also be utilized in this invention.

The embodiments shown in FIGS. 4(a) and 4(b) can also be regarded structures as below: a cover (i.e. the reflection cover 411) with an opening (i.e. the hole 414) exposure the light emitting device 401/421 and part of the touch sensing conductor 405; also, the cover touches the touch sensing conductor 405. The opening is utilized for touch control light emitting region, and the inclined planes 415, 417 define the opening. Additionally, a sealing glue material (the epoxy 413) fills the opening to provide a flat touch control light emitting surface. The sealing glue material fills the space defined by the cover and the circuit board 409, and covers the light emitting device 401/421 and part of the touch sensing conductor 405.

Figure 5:
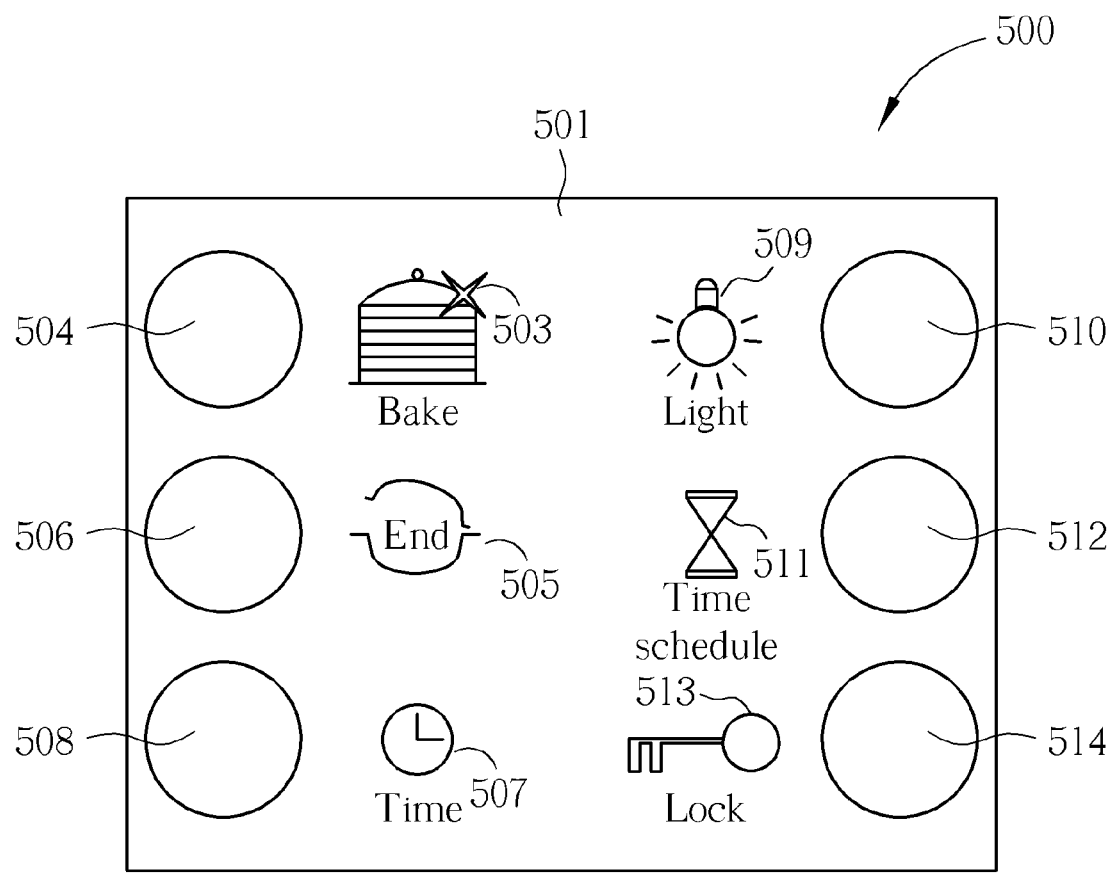
FIG. 5 is a schematic diagram illustrating the touch control button apparatus according to an embodiment of the present application.

FIG. 5 is a schematic diagram illustrating the touch control button apparatus 500 according to an embodiment of the present application. In this embodiment, the touch control button apparatus 500 is utilized for an electronic apparatus. As shown in FIG. 5, the touch control button apparatus 500 includes a touch control panel 501 with a plurality of touch control buttons 503, 505, 507, 509, 511 and 513. If any one of the touch control buttons 503, 505, 507, 509, 511 and 513 is touched, the touched one will emit light. The emitted light is from a corresponding light emitting device under the touched touch control button, and the electronic apparatus utilizing the touch control button apparatus 500 will perform corresponding operation. For example, if the touch control button 503 is touched, the touch control button 503 will emit light and the electronic apparatus will perform a baking operation. Besides, the touch control regions 504, 506, 508, 510, 512 and 514 corresponding to the touch control buttons 503, 505, 507, 509, 511 and 513 can also active touch control buttons 503, 505, 507, 509, 511 and 513 and corresponding functions. For example, if the touch control region 510 is touched, the touch control button 509 will emit light, and the electronic apparatus utilizing the touch control button apparatus 500 will turn on light thereof as well.

Figure 6:
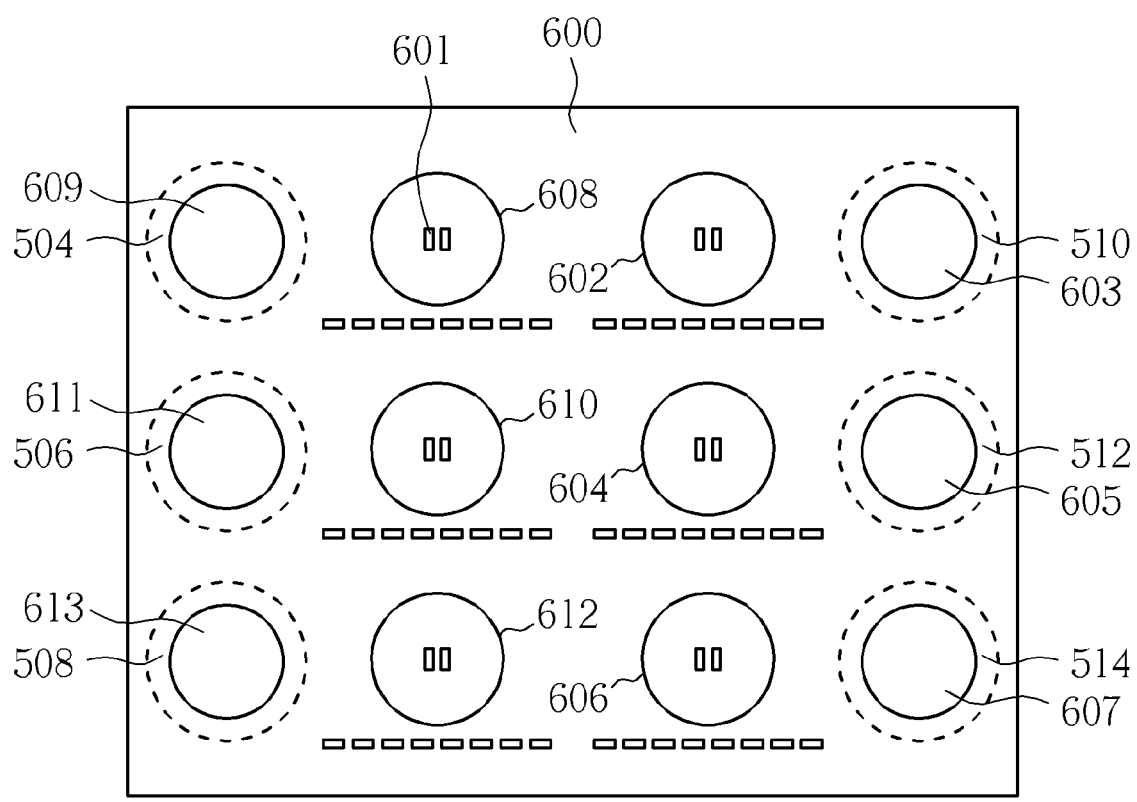
FIG. 6 is a schematic diagram illustrating the touch control button apparatus shown in FIG. 5 without a touch control panel.

FIG. 6 is a schematic diagram illustrating the touch control button apparatus shown in FIG. 5 without a touch control panel. As shown in FIG. 6, at least one light emitting device 601 is provided on the circuit board 600, under the touch control buttons 503, 505, 507, 509, 511 and 513. First copper foil regions 603, 605, 607, 609, 611 and 613 are respectively under the touch control regions 504, 506, 508, 510, 512 and 514, and second copper foil regions 602, 604, 606, 608, 610 and 612 are respectively under the touch control buttons 503, 505, 507, 509, 511 and 513. The first and second copper foil regions 602613 are part of the touch sensing buttons. Accordingly, if any one of the touch control regions 504, 506, 508, 510, 512 and 514, and the touch control buttons 503, 505, 507, 509, 511 and 513 is touched, the sensed capacitance of the corresponding first and second copper foil regions 602-613 will change, thus the touch control region or the touch control button can be determined to be touched.

Figure 7:
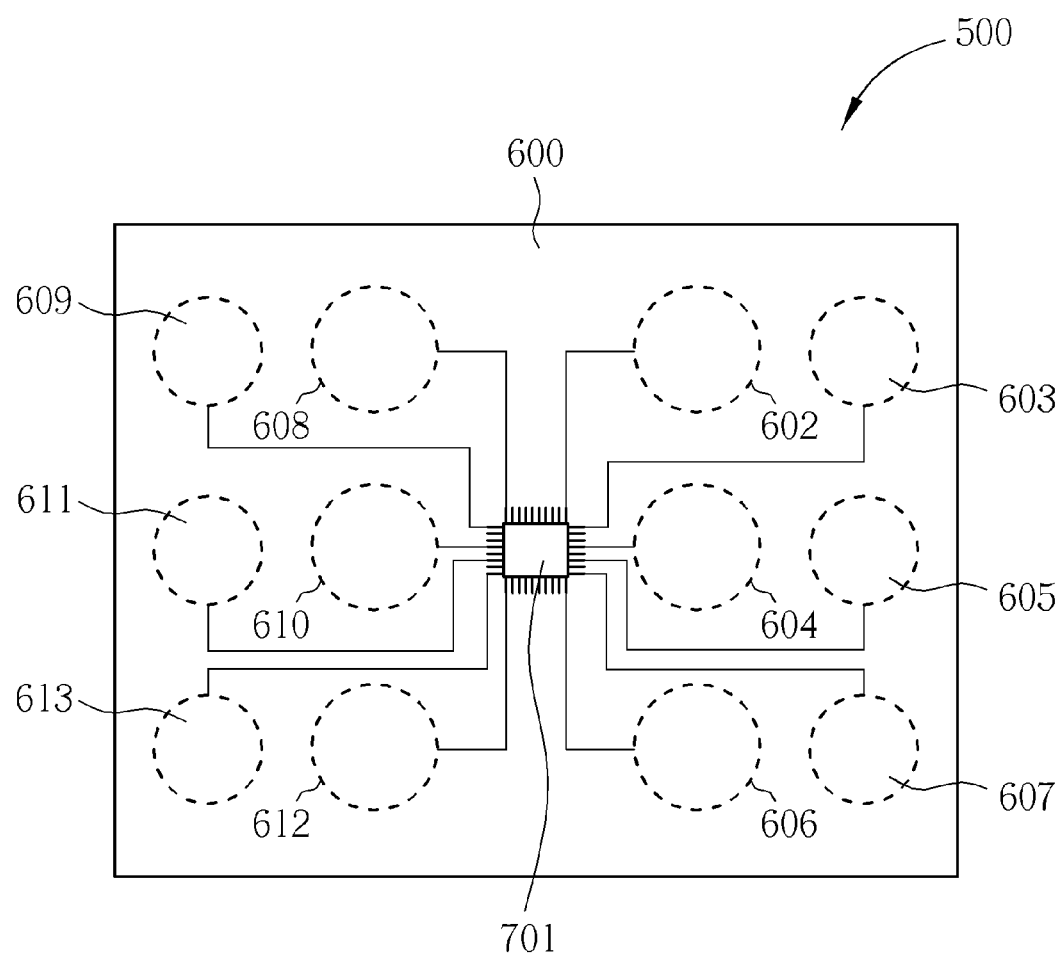
FIG. 7 is a back view of the touch control button apparatus shown in FIG. 5.

FIG. 7 is a back view of the touch control button apparatus 500 shown in FIG. 5. As shown in FIG. 7 a control IC 701 is provided at a back side of the circuit board 600. That is, the IC 701 and the light emitting device are provided at different sides of the circuit board 600. Besides, the touch sensing apparatus 210 and the light emitting control device 212 shown in FIG. 2 can also be integrated to the control IC 701. In this embodiment, the control IC 701 is electrically coupled to the touch control buttons 503, 505, 507, 509, 511 and 513, and the first, second copper foil regions 602-613 corresponding to the touch control regions 504, 506, 508, 510, 512 and

514. By this way, the control IC 701 can sense the touch of the touch control buttons or the touch control regions to control the light emission of the light emitting device 601, and can determine the corresponding operation of the electronic apparatus utilizing the touch control button.

It should be noted that the above mentioned light emitting device number and the location of each device is only for example and do not mean to limit the scope of the present application.

According to above-mentioned embodiment, the touch control button, the light emitting device and the touch sensing conductor can be provided in the same region (i.e. the light emitting device is provided between the touch control button and the touch sensing conductor). By this way, the manufacturing process can be simplified and the convenience for designing a peripheral circuit can be increased.

Those skilled in the art will readily observe that numerous modifications and alterations of the device and method may be made while retaining the teachings of the invention.

What is claimed is:

1. A touch control button apparatus, comprising:
   a circuit board;
   a touch control light emitting surface arranged above the circuit board with a distance;
   a touch sensing conductor disposed on the circuit board to produce a capacitance value variation if the touch control light emitting surface is touched by an object;
   a touch sensing device, for detecting the capacitance value variation of the touch sensing conductor; and
   a light emitting device disposed on the circuit board, under the touch control light emitting surface and surrounded by the touch sensing conductor;
   wherein the touch sensing device detects the capacitance value variation of the touch sensing conductor when the touch control light emitting surface is touched by the object, to determine if the light emitting device is lightened; and
   a sealing material filled in the space defined by the circuit board and the touch control light emitting surface and covering the circuit board, the light emitting device and the touch sensing conductor so as to form a flat touch control light emitting surface.

2. The touch control button apparatus of claim 1, wherein the light emitting device is a light emitting diode (LED) or a surface mount device (SMD).

3. The touch control button apparatus of claim 1, wherein the touch control light emitting surface and the touch sensing conductor are arranged in a non-planner manner, and the touch sensing conductor is ring-shaped to surround the light emitting device.

4. The touch control button apparatus of claim 1, further comprising a light emitting control device, wherein the light emitting control device receives a signal from the touch sensing device, to determine if the light emitting device emits light or not.

5. The touch control button apparatus of claim 4, wherein the touch sensing device and the light emitting control device are integrated to an integration circuit (IC).

6. The touch control button apparatus of claim 5, wherein the integration circuit and the light emitting device are arranged at different sides of the circuit board.

7. The touch control button apparatus of claim 1, wherein the sealing material is epoxy.

8. The touch control button apparatus of claim 7, further comprising a reflection cover, for defining light emitting location of the touch control light emitting surface.

9. An electronic apparatus, comprising:
   a touch control button, comprising a touch control panel, including at least one touch control button;
   a circuit board;
   a touch sensing conductor disposed on the circuit board to produce a capacitance value variation if the touch control light emitting surface is touched by an object;
   a touch sensing device, for detecting the capacitance value variation of the touch sensing conductor;
   at least one light emitting device disposed on the circuit board, under the touch control light emitting surface and surrounded by the touch sensing conductor; and
   a sealing material filled in the space defined by the circuit board and the touch control light emitting surface and covering the circuit board, the light emitting device and the touch sensing conductor so as to form a flat touch control light emitting surface;
   wherein the touch sensing device detects the capacitance value variation of the touch sensing conductor when the touch control light emitting surface is touched by the object, to determine if the light emitting device is lightened.

10. The electronic apparatus of claim 9, wherein the light emitting device is a light emitting diode (LED) or a surface mount device (SMD).

11. The electronic apparatus of claim 9, further comprising a light emitting control device, wherein the light emitting control device receives a signal from the touch sensing device, to determine if the light emitting device emits light or not.

12. The electronic apparatus of claim 11, wherein the touch sensing device and the light emitting control device are integrated to an integration circuit (IC).

13. The electronic apparatus of claim 12, wherein the integration circuit and the light emitting device are arranged at different sides of the circuit board.

14. The electronic apparatus of claim 9, wherein the touch control light emitting surface and the touch sensing conductor are arranged in a non-planner manner, and the touch sensing conductor is ring-shaped to surround the light emitting device.

15. The electronic apparatus of claim 9, wherein the sealing material is epoxy.

16. A touch control button apparatus, comprising:
   a circuit board;
   at least one light emitting device disposed on the circuit board;
   a touch sensing conductor, disposed on the circuit board;
   a cover, having an opening to exposure the light emitting device and part of the touch sensing conductor; and
   a sealing glue material, filling the opening and a space defined by the cover to provide a flat touch control light emitting surface; wherein the opening is utilized as a touch control light emitting region;
   wherein the circuit board, the light emitting device and the cover are fixed by the sealing glue material.

17. The touch control button apparatus of claim 16, wherein the touch sensing conductor is surrounding the light emitting device.

18. The touch control button apparatus of claim 16, wherein the cover touches the touch sensing conductor.

19. The touch control button apparatus of claim 16, wherein the cover includes a plurality of inclined planes that defines the opening

* * * * *